(12) United States Patent
Ikeda et al.

(10) Patent No.: US 10,818,470 B2
(45) Date of Patent: Oct. 27, 2020

(54) CHARGED PARTICLE BEAM DEVICE

(71) Applicant: Hitachi High-Technologies Corporation, Minato-Ku, Tokyo (JP)

(72) Inventors: Kazuki Ikeda, Tokyo (JP); Wen Li, Tokyo (JP); Takuma Nishimoto, Tokyo (JP); Hiroyuki Takahashi, Tokyo (JP); Wataru Mori, Tokyo (JP); Makoto Suzuki, Tokyo (JP); Hajime Kawano, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/491,819

(22) PCT Filed: Mar. 6, 2017

(86) PCT No.: PCT/JP2017/008755
§ 371 (c)(1),
(2) Date: Sep. 6, 2019

(87) PCT Pub. No.: WO2018/163240
PCT Pub. Date: Sep. 13, 2018

(65) Prior Publication Data
US 2020/0043695 A1 Feb. 6, 2020

(51) Int. Cl.
*H01J 37/147* (2006.01)
*H01J 37/22* (2006.01)
*H01J 37/28* (2006.01)

(52) U.S. Cl.
CPC ...... *H01J 37/1477* (2013.01); *H01J 37/1475* (2013.01); *H01J 37/22* (2013.01);
(Continued)

(58) Field of Classification Search
CPC ............... H01J 37/1474; H01J 37/1475; H01J 37/1477; H01J 37/22; H01J 37/28; H01J 2237/1518; H01J 2237/1526
See application file for complete search history.

(56) References Cited

U.S. PATENT DOCUMENTS 5,900,629 A * 5/1999 Todokoro ............. H01J 37/145
250/310
2013/0292568 A1* 11/2013 Bizen .................... H01J 37/244
250/307
(Continued)

FOREIGN PATENT DOCUMENTS

JP     S53131755 A     11/1978
JP     H09171791 A     6/1997
(Continued)

*Primary Examiner* — David E Smith
(74) *Attorney, Agent, or Firm* — Miles & Stockbridge, P.C.

(57) ABSTRACT

A charged particle beam device includes a deflection unit that deflects a charged particle beam released from a charged particle source to irradiate a sample, a reflection plate that reflects secondary electrons generated from the sample, and a control unit that controls the deflection unit based on an image generated by detecting the secondary electrons reflected from the reflection plate. The deflection unit includes an electromagnetic deflection unit that electromagnetically scans with the charged particle beam by a magnetic field and an electrostatic deflection unit that electrostatically scans with the charged particle beam by an electric field. The control unit controls the electromagnetic deflection unit and the electrostatic deflection unit, superimposes an electromagnetic deflection vector generated by the electromagnetic scanning and an electrostatic deflection vector generated by the electrostatic scanning, and controls at least a trajectory of the charged particle beam.

6 Claims, 3 Drawing Sheets

(52) U.S. Cl.
CPC ....... *H01J 37/28* (2013.01); *H01J 2237/1518* (2013.01); *H01J 2237/1526* (2013.01)

(56) References Cited

U.S. PATENT DOCUMENTS

2015/0357153 A1* 12/2015 Makino ................... H01J 37/28
250/310
2015/0357155 A1* 12/2015 Dohi ..................... H01J 37/147
250/307

FOREIGN PATENT DOCUMENTS

| | | |
|---|---|---|
| JP | 2009272232 A | 11/2009 |
| JP | 2014010928 A | 1/2014 |
| JP | 2014143096 A | 8/2014 |

* cited by examiner

[FIG. 1]
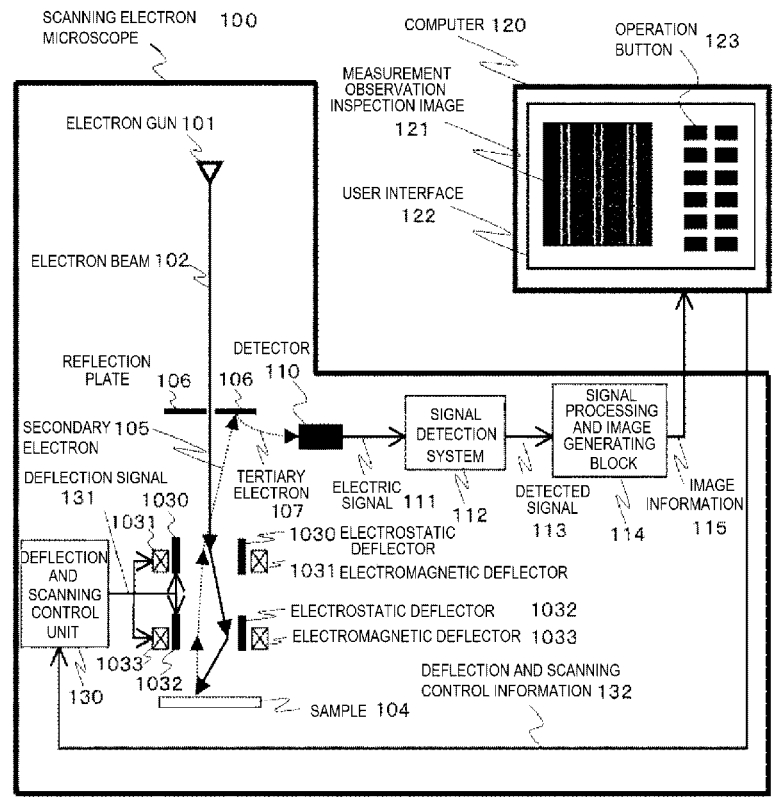
[FIG. 2]
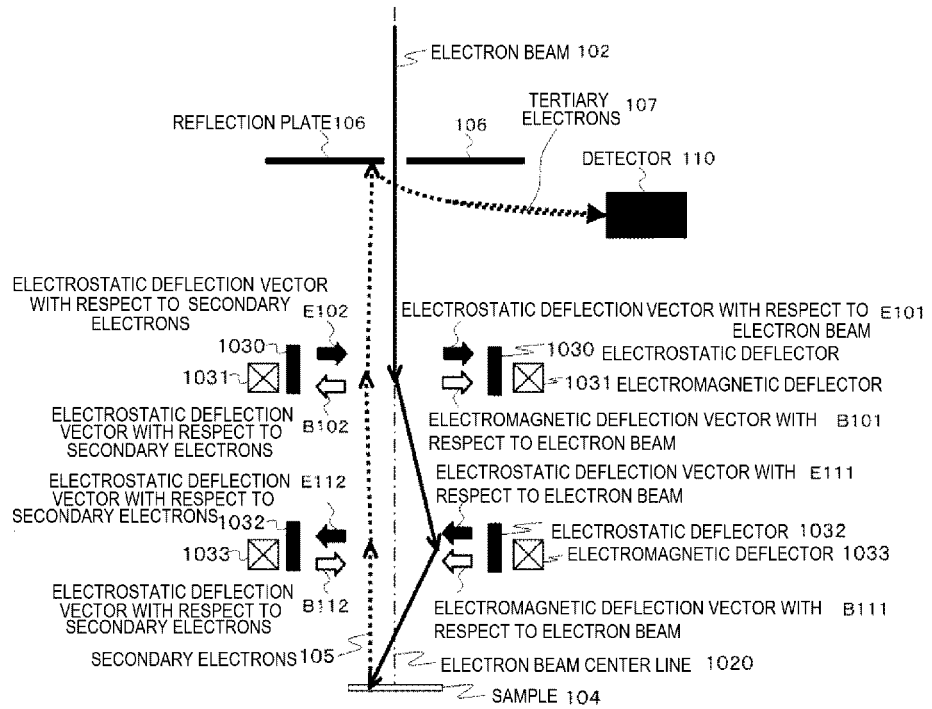

[FIG. 3]
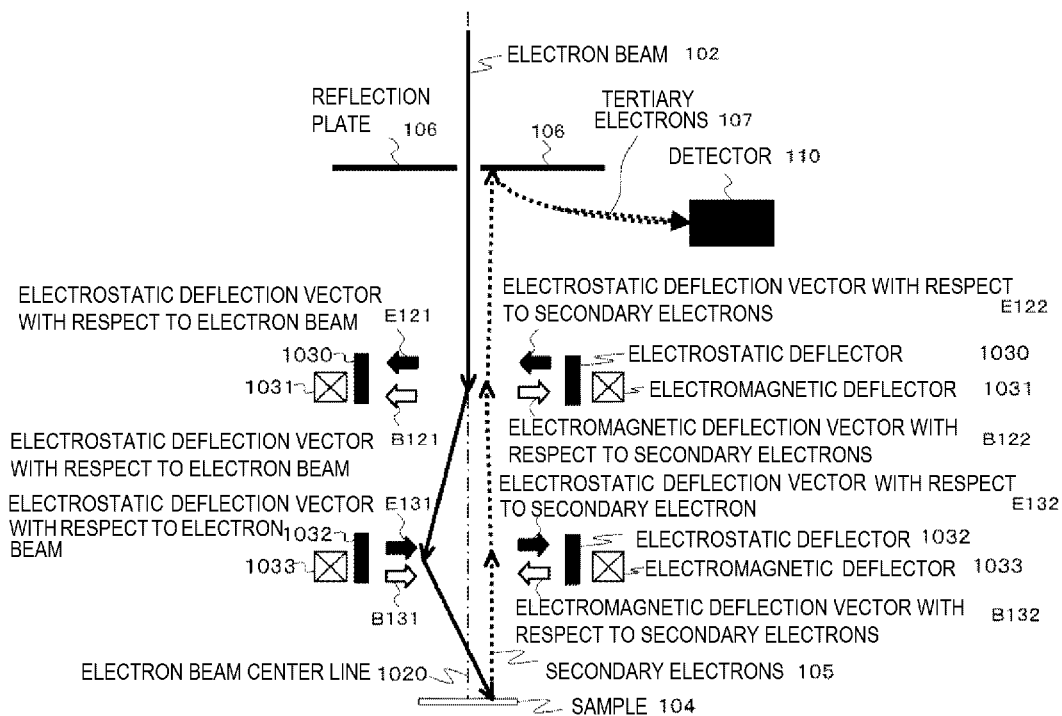
[FIG. 4]
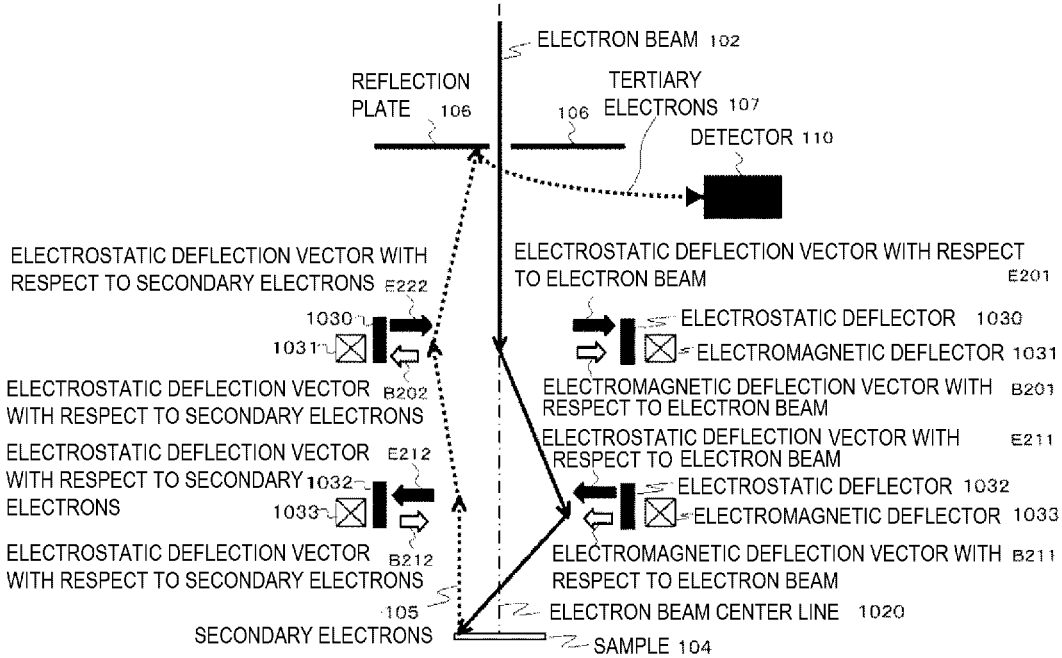

[FIG. 5]
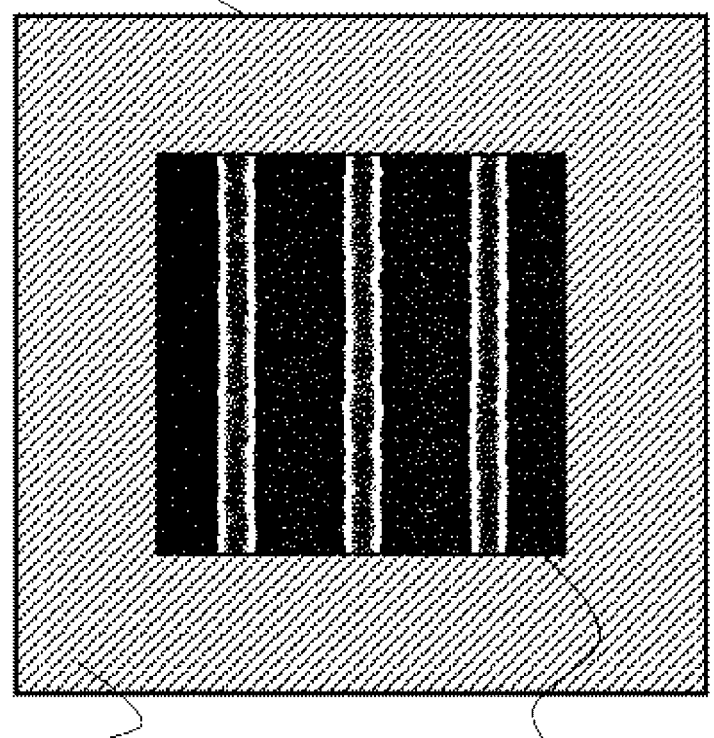

CHARGED PARTICLE BEAM DEVICE

TECHNICAL FIELD

The present invention relates to a charged particle beam device.

BACKGROUND ART

In a semiconductor manufacturing process, a measurement inspection device such as an electron microscope (SEM) using a scanning electron beam method is used to measure and inspect a circuit pattern on a wafer so as to detect an abnormality or a failure (defect).

For example, PTL 1 discloses a technique related to the measurement inspection device, in which an electron beam is deflected by a deflector to irradiate a sample, secondary electrons generated from the sample are reflected by a reflection plate, and the reflected secondary electrons are detected to obtain an inspection image.

PRIOR ART LITERATURE

Patent Literature

PTL 1: JP-A-2014-010928

SUMMARY OF INVENTION

Technical Problem

When the electron beam is deflected by the deflector to scan the sample, a trajectory of the secondary electrons generated from the sample may be excessively deflected so the secondary electrons may not arrive at the reflection plate. When the secondary electrons do not arrive at the reflection plate, the number of the secondary electrons reflected by the reflection plate decreases and detection efficiency of the secondary electrons is reduced. When the detection efficiency of the secondary electrons is reduced, S/N of a detected signal is reduced and image quality of the obtained inspection image is also reduced.

PTL 1 does not mention the reduction in detection efficiency of the secondary electrons generated when scanning is performed with the electron beam.

An object of the invention is to prevent a reduction in detection efficiency of secondary electrons in a charged particle beam device.

Solution to Problem

A charged particle beam device according to an aspect of the invention includes a deflection unit that deflects a charged particle beam emitted from a charged particle source to irradiate a sample, a reflection plate that reflects secondary electrons generated from the sample, and a control unit that controls the deflection unit based on an image generated by detecting the secondary electrons reflected from the reflection plate. The deflection unit includes an electromagnetic deflection unit that electromagnetically performs scanning with the charged particle beam by a magnetic field and an electrostatic deflection unit that electrostatically performs scanning with the charged particle beam by an electric field. The control unit controls the electromagnetic deflection unit and the electrostatic deflection unit, superimposes an electromagnetic deflection vector generated by the electromagnetic scanning and an electrostatic deflection vector generated by the electrostatic scanning, and controls at least a trajectory of the charged particle beam.

Advantageous Effect

According to the aspect of the invention, the reduction in detection efficiency of secondary electrons in a charged particle beam device can be prevented.

BRIEF DESCRIPTION OF DRAWINGS

FIG. 1 shows a charged particle beam device (measurement observation inspection device).

FIG. 2 shows a method of controlling a trajectory of secondary electrons by scanning with an electron beam to a left side of a sample according to a first embodiment.

FIG. 3 shows a method of controlling the trajectory of secondary electrons by scanning with an electron beam to a right side of the sample according to the first embodiment.

FIG. 4 shows a method of correcting an insufficient visual field by an electrostatic deflection according to a second embodiment.

FIG. 5 shows an example of the insufficient visual field generated at an edge of an inspection image.

DESCRIPTION OF EMBODIMENTS

Hereinafter, embodiments will be described with reference to the drawings.

First Embodiment

First, a first embodiment will be described with reference to FIGS. 1 to 3.

In the first embodiment, scanning with a charged particle beam (an electron beam) and a deflection of secondary electrons are dynamically controlled by a vector obtained by superimposing an electromagnetic deflection and scanning vector and an electrostatic deflection and scanning vector to allow the second electrons to arrive at a predetermined position of a reflection plate.

FIG. 1 shows an example (schematic) of a measurement observation inspection device (charged particle beam device) using a scanning electron microscope.

As shown in FIG. 1, the measurement observation inspection device includes a scanning electron microscope 100 and a computer 120. The scanning electron microscope 100 includes an electron gun (charged particle source) 101, electrostatic deflectors 1030 and 1032, electromagnetic deflectors 1031 and 1033, a sample 104 as a target of an measurement observation inspection, a reflection plate 106, a detector 110, a signal detection system 112, a signal processing and image generating block 114, and a deflection and scanning control unit 130.

Here, the electron gun (charged particle source) 101 irradiates the sample 104 with an electron beam (charged particle beam) 102. The electrostatic deflectors 1030 and 1032 and the electromagnetic deflectors 1031 and 1033 perform scan with the electron beam 102 and control a trajectory of secondary electrons 105. The reflection plate 106 reflects the secondary electrons 105 generated from the sample 104 irradiated by the electron beam 102. The detector 110 converts tertiary electrons 107 reflected from the reflection plate 106 into an electrical signal 111. The signal detection system 112 outputs a detected signal 113 from the electrical signal 111. The signal processing and image generating block 114 generates image information 115 from the detected signal 113. The deflection and scanning control unit 130 generates a deflection signal 131 to control the electrostatic deflectors 1030 and 1032 and the electromagnetic deflectors 1031 and 1033 by deflection and scanning control information 132 from the computer 120.

The image information 115 of the measurement observation inspection output from the signal processing and image generating block 114 is transmitted to the computer 120 and is displayed on a user interface screen 122 as a measurement observation inspection image 121.

By operating (pressing) an operation button 123 on the user interface 122, the deflection and scanning control information 132 is output from the computer 120 and the deflection and scanning control unit 130 changes a scanning range of the electron beam 102. Therefore, the measurement observation inspection image 121 at different positions of the sample 104 is obtained.

A method of simultaneously controlling the electrostatic deflector and the electromagnetic deflector, superimposing the electrostatic deflection vector and the electromagnetic deflection vector, and dynamically controlling the scan with the electron beam 102 and the deflection of the secondary electrons 105 will be described with reference to FIGS. 1 to 3.

Here, FIG. 2 shows a method of superimposing the electrostatic deflection vector and the electromagnetic deflection vector and controlling the trajectory of the scanning with the electron beam 102 to the left side of the sample 104 and the trajectory of the secondary electrons 105. FIG. 3 shows a method of superimposing the electrostatic deflection vector and the electromagnetic deflection vector and controlling the trajectory of the scanning with the electron beam 102 to the right side of the sample 104 and the trajectory of the secondary electrons 105.

First, the computer 120 operates the scanning electron microscope 100 to set a measurement condition of the sample 104 and a scanning region of the electron beam 102. The deflection and scanning control information 132 corresponding to the set scanning region is transmitted to the deflection and scanning control unit 130 and converted into the deflection signal 131 to control the electrostatic deflectors 1030 and 1032 and the electromagnetic deflectors 1031 and 1033.

The electron beam 102 scans the set scanning region according to a vector obtained by superimposing an electrostatic deflection vector E101 with respect to the electron beam by the electrostatic deflector 1030 and an electromagnetic deflection vector B101 with respect to the electron beam by the electromagnetic deflector 1031, and a vector obtained by superimposing an electrostatic deflection vector E111 with respect to the electron beam by the electrostatic deflector 1032 and an electromagnetic deflection vector B111 with respect to the electron beam by the electromagnetic deflector 1033.

One the other hand, the secondary electrons 105 are deflected to a trajectory towards the reflection plate 106 by a vector obtained by superimposing an electrostatic deflection vector E102 with respect to the secondary electrons by the electrostatic deflector 1030 and an electromagnetic deflection vector B102 with respect to the secondary electrons by the electromagnetic deflector 1031, and a vector obtained by superimposing an electrostatic deflection vector E112 with respect to the secondary electrons by the electrostatic deflector 1032 and an electromagnetic deflection vector B112 with respect to the secondary electrons by the electromagnetic deflector 1033.

At this time, the electrostatic deflection vectors E101 and E102 and the electrostatic deflection vectors E111 and E112 generate deflection vectors in the same direction by Coulomb force regardless of moving directions of the electron beam 102 and the secondary electrons 105. On the other hand, since the moving directions of the electron beam 102 and the secondary electrons 105 are opposite, the electromagnetic deflection vectors B101 and B102 and the electromagnetic deflection vectors B111 and B112 generate deflection vectors in opposite directions by Lorentz force.

Therefore, the deflection vectors are superimposed such that the electrostatic deflection vector E101 and the electromagnetic deflection vector B101 with respect to the electron beam 102 are superimposed in the same deflection direction so that the electrostatic deflection vector E102 and the electromagnetic deflection vector B102 with respect to the secondary electrons 105 are superimposed in opposite directions and canceled.

Similarly, the deflection vectors are superimposed such that the electrostatic deflection vector E111 and the electromagnetic deflection vector B111 with respect to the electron beam 102 are superimposed in the same deflection direction so that the electrostatic deflection vector E112 and the electromagnetic deflection vector B112 with respect to the secondary electrons 105 are superimposed in opposite directions and canceled.

That is, when the scanning with the electron beam 102 is performed to the left side of an electron beam center line 1020 (see FIG. 2) and when the scanning is performed to the right side of the electron beam center line 1020 (see FIG. 3), the superimposed deflection vectors that affects the trajectory of the secondary electrons 105 are reduced as compared with the superimposed deflection vectors that perform scanning with the electron beam 102. As a result, the secondary electrons 105 are centralized and arrive at a predetermined position of the reflecting plate 106.

Further, in order to improve accuracy of an arrival position of the secondary electrons 105 on the reflection plate 106, it is necessary to increase a deflection speed of the secondary electrons 105 to be larger than a scanning speed of the electron beam 102. This can be achieved by performing deflection control of the electrostatic deflection vector E102 or E112 without using a magnetic body at a speed higher than that of the electromagnetic deflection vector B102 or B112 whose deflection speed is limited by a frequency characteristic of a magnetic body.

According to the first embodiment, the secondary electrons 105 can be centralized and arrive at a predetermined position of the reflection plate 106 by simultaneously controlling the trajectory of the scanning with the electron beam 102 and the trajectory of the secondary electrons 105. Accordingly, the secondary electrons 105 can be efficiently detected without missing the secondary electrons 105 outside the reflection plate 106. As a result, S/N of the detected signal can be improved and image quality of the inspection image can be improved.

Second Embodiment

Next, a second embodiment will be described with reference to FIGS. 1, 4, and 5. In the second embodiment, an insufficient visual field at an edge of a measurement observation inspection image is corrected by a deflection vector by an electrostatic deflector.

A method of correcting the insufficient visual field generated at the edge of the measurement observation inspection image by superimposing an electrostatic deflection vector and an electromagnetic deflection vector and dynamically controlling the electrostatic deflection vector will be described with reference to FIGS. 1, 4, and 5.

First, the computer 120 operates the scanning electron microscope 100 to set a measurement condition of the sample 104 and a scanning region of the electron beam 102. The deflection and scanning control information 132 corresponding to the set scanning region is transmitted to the deflection and scanning control unit 130 and converted into the deflection signal 131 to control the electrostatic deflectors 1030 and 1032 and the electromagnetic deflectors 1031 and 1033.

As shown in FIG. 5, when the scanning region of the electron beam 102 is insufficient with respect to a set measurement observation inspection image 1210, the electron beam 102 does not scan a position of the sample 104 that should be arrived at and an insufficient visual field region 1212 is generated around a visual field 1211.

When the insufficient visual field region 1212 is generated, the deflection and scanning control information 132 is transmitted from the computer 120 and converted into the deflection signal 131 by the deflection and scanning control unit 130 to control the electrostatic deflectors 1030 and 1032 and enlarge the scanning region of the electron beam 102.

Specifically, compared to the electrostatic deflection vectors E101 and E111 with respect to the electron beam in a state where the visual field of the measurement observation inspection image 121 is obtained (see FIG. 2), the deflection signal 131 that increases the electrostatic deflection vectors E201 and E211 is given to the electrostatic deflectors 1030 and 1032. Then, as shown in FIG. 4, a deflection amount of the electron beam 102 is corrected so that the visual field of the measurement observation inspection image 1210 is appropriate.

According to the second embodiment, the electrostatic deflection vectors with respect to the electron beam 102 by the electrostatic deflectors 1030 and 1032 are dynamically controlled according to the visual field of the measurement observation inspection image 1210. Therefore, the visual field of the measurement observation inspection image 1210 is corrected and image quality of the inspection image is improved.

REFERENCE SIGN LIST 100 scanning electron microscope
101 electron gun
102 electron beam
1020 electron beam center line
1030, 1032 electrostatic deflector
1031, 1033 electromagnetic deflector
104 sample
105 secondary electron
106 reflection plate
107 tertiary electron
110 detector
111 electric signal
112 signal detection system
113 detected signal
114 signal processing and image generating block
115 image information
120 computer
121 measurement observation inspection image
122 user interface
123 operation button
130 deflection and scanning control unit
131 deflection signal
132 deflection and scanning control information
1210 measurement observation inspection image
1211 visual field
1212 insufficient visual field

The invention claimed is:

1. A charged particle beam device, comprising:
a deflection unit that deflects a charged particle beam emitted from a charged particle source to irradiate a sample;
a reflection plate that reflects secondary electrons generated from the sample; and
a control unit that controls the deflection unit based on an image generated by detecting the secondary electron reflected from the reflection plate, wherein
the deflection unit includes an electromagnetic deflection unit that electromagnetically performs scanning with the charged particle beam by a magnetic field and an electrostatic deflection unit that electrostatically performs scanning with the charged particle beam by an electric field,
the control unit controls the electromagnetic deflection unit and the electrostatic deflection unit, superimposes an electromagnetic deflection vector generated by the electromagnetic scanning and an electrostatic deflection vector generated by the electrostatic scanning, and controls a trajectory of the charged particle beam,
the control unit performs control to superimpose the electromagnetic deflection vector and the electrostatic deflection vector and scan the sample with the charged particle beam from a first scanning position to a second scanning position, and
the control unit performs control so that the electrostatic deflection vector is in opposite directions in the first scanning position and the deflection vector is in the same direction in the first scanning position and the second scanning position.

2. The charged particle beam device according to claim 1, wherein
the control unit performs control to superimpose the electrostatic deflection vector and the electromagnetic deflection vector with respect to the charged particle beam in a same direction, and performs control to superimpose the electrostatic deflection vector and the electromagnetic deflection vector with respect to the secondary electrons in opposite directions.

3. The charged particle beam device according to claim 2, wherein
the control unit performs control so that the secondary electrons arrive at a predetermined position of the reflection plate.

4. The charged particle beam device according to claim 1, wherein
the electromagnetic deflection unit includes a first electromagnetic deflection unit disposed on an upstream side of an irradiation direction of the charged particle beam and a second electromagnetic deflection unit disposed on a downstream side of the irradiation direction of the charged particle beam,
the electrostatic deflection unit includes a first electrostatic deflection unit disposed on the upstream side of the irradiation direction of the charged particle beam and a second electrostatic deflection unit disposed on the downstream side of the irradiation direction of the charged particle beam, and
the control unit performs control to
change the trajectory of the charged particle beam into a first direction by a first superimposed vector obtained by superimposing a first electrostatic deflection vector by the first electrostatic deflection unit and a first electromagnetic deflection vector by the first electromagnetic deflection unit, and change the trajectory of the charged particle beam in a second direction different from the first direction by a second superimposed vector obtained by superimposing a second electrostatic deflection vector by the second electrostatic deflection unit and a second electromagnetic deflection vector by the second electromagnetic deflection unit.

5. The charged particle beam device according to claim 1, wherein the control unit controls trajectories of the charged particle beam and the secondary electrons by superimposing the electrostatic deflection vector and the electromagnetic deflection vector in a state where magnitude of the electrostatic deflection vector is larger than magnitude of the electromagnetic deflection vector.

6. The charged particle beam device according to claim 5, wherein the control unit controls the deflection unit based on the image generated based on the secondary electrons whose trajectory is controlled and corrects a deflection amount of the charged particle beam.

* * * * *

UNITED STATES PATENT AND TRADEMARK OFFICE
CERTIFICATE OF CORRECTION

PATENT NO. : 10,818,470 B2  
APPLICATION NO. : 16/491819  
DATED : October 27, 2020  
INVENTOR(S) : Kazuki Ikeda et al.

Page 1 of 1

It is certified that error appears in the above-identified patent and that said Letters Patent is hereby corrected as shown below:

On the Title Page

(71) Applicant: "HITACHI HIGH-TECHNOLOGIES CORPORATION" should read --HITACHI HIGH-TECH CORPORATION--

In the Claims

At Column 6, Claim number 1, Line number 34-35, "the deflection vector" should read --the second scanning position and performs control so that the electromagnetic deflection vector--

Signed and Sealed this  
Twenty-seventh Day of July, 2021

Drew Hirshfeld  
*Performing the Functions and Duties of the*  
*Under Secretary of Commerce for Intellectual Property and*  
*Director of the United States Patent and Trademark Office*